(12) United States Patent
Chen et al.

(10) Patent No.: US 12,224,739 B2
(45) Date of Patent: Feb. 11, 2025

(54) FAST-TRANSIENT BUFFER

(71) Applicant: MEDIATEK INC., Hsinchu (TW)

(72) Inventors: Yueh-Min Chen, Hsinchu (TW);
Ting-Yang Wang, Hsinchu (TW);
Yu-Hsin Lin, Hsinchu (TW);
Wen-Chieh Wang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 41 days.

(21) Appl. No.: 18/299,852

(22) Filed: Apr. 13, 2023

(65) Prior Publication Data

US 2023/0396246 A1 Dec. 7, 2023

Related U.S. Application Data

(60) Provisional application No. 63/347,599, filed on Jun. 1, 2022.

(51) Int. Cl.
*H03K 17/16* (2006.01)
*H03K 17/06* (2006.01)
*H03K 17/687* (2006.01)

(52) U.S. Cl.
CPC ......... *H03K 17/162* (2013.01); *H03K 17/063* (2013.01); *H03K 17/6872* (2013.01)

(58) Field of Classification Search
CPC ............... H03K 17/162; H03K 17/063; H03K 17/6872; H03F 2203/5021; H03F 3/505; G05F 1/575
See application file for complete search history.

(56) References Cited

U.S. PATENT DOCUMENTS

| 9,746,864 | B1 | 8/2017 | Narang |
| 2016/0259354 | A1 | 9/2016 | Maeng et al. |
| 2023/0396246 | A1 | 12/2023 | Chen |

FOREIGN PATENT DOCUMENTS

EP 3104523 A1 * 12/2016 ............. H03F 3/195

OTHER PUBLICATIONS

Extended European Search Report dated Oct. 23, 2023, issued in application No. EP 23174118.2.
Li, C., et al.; "FVF LDO regulator with dual dynamic-load composite gain stage;" Analog Integr Circ Sig Process; Apr. 2017; pp. 131-140.
Pappiah, M., et al.; "Capacitor-less FVF low drop-out regulator with active feed-forward compensation and efficient slew-rate enhancer circuit;" IET Circuits, Devices & Systems; Sep. 2020; pp. 853-859.

(Continued)

*Primary Examiner* — Metasebia T Retebo
(74) *Attorney, Agent, or Firm* — McClure, Qualey & Rodack, LLP

(57) ABSTRACT

A fast-transient buffer is shown. The fast-transient buffer has a flipped voltage follower coupled between the input terminal and the output terminal of the fast-transient buffer, and a first MOS transistor coupled to the flipped voltage follower as well as the output terminal of the fast-transient buffer. The first MOS transistor regulates the output voltage of the output terminal of the fast-transient buffer, in the opposite direction in comparison with an output voltage regulation direction due to the flipped voltage follower.

15 Claims, 5 Drawing Sheets

(56) References Cited

OTHER PUBLICATIONS

Zeng, Y., et al.; "A push-pulled FVF based output-capacitorless LDO with adaptive power transistors;" Microelectronics Journal 64; Jun. 2017; pp. 69-77.
Chinese language office action dated Mar. 1, 2024, issued in application No. TW 112119125.
Carvajal R. G. et al.; "The Flipped Voltage Follower: A Useful Cell for Low-Voltage Low-Power Circuit Design;" IEEE Transactions on Circuits and Systems—I: Regular Papers, vol. 52, No. 7; Jul. 2005; pp. 1276-1291.
Chinese language office action dated Jun. 13, 2024, issued in application No. TW 112119125.

* cited by examiner

FAST-TRANSIENT BUFFER

CROSS REFERENCE TO RELATED APPLICATIONS

This application claims the benefit of U.S. Provisional Application No. 63/347,599, filed Jun. 1, 2022 the entirety of which is incorporated by reference herein.

BACKGROUND OF THE INVENTION

Field of the Invention

The present invention relates to fast-transient buffers.

Description of the Related Art

With the evolution of semiconductor technology, fast-transient buffers are called for in low-power and low-voltage circuit design.

BRIEF SUMMARY OF THE INVENTION

Fast-transient buffers for low-power and low-voltage operations are shown.

A fast-transient buffer in accordance with an exemplary embodiment of the present invention has a flipped voltage follower coupled between the input terminal and the output terminal of the fast-transient buffer, and a first MOS transistor coupled to the flipped voltage follower as well as the output terminal of the fast-transient buffer. The first MOS transistor regulates the output voltage of the output terminal of the fast-transient buffer, in the opposite direction of the output voltage regulation direction due to the flipped voltage follower.

In an exemplary embodiment, the first MOS transistor has a gate terminal coupled to the flipped voltage follower, and has a drain terminal coupled to the output terminal of the fast-transient buffer.

In an exemplary embodiment, the flipped voltage follower has a second MOS transistor and a third MOS transistor. The second MOS transistor has a gate terminal coupled to the input terminal of the fast-transient buffer, a source terminal coupled to the output terminal of the fast-transient buffer, and a drain terminal coupled to the gate terminal of the first MOS transistor. The third MOS transistor has a drain terminal coupled to the source terminal of the second MOS transistor, and a gate terminal coupled to the drain terminal of the second MOS transistor.

In an exemplary embodiment, the fast-transient buffer further has a bias circuit that is coupled to the flipped voltage follower.

In an exemplary embodiment, the flipped voltage follower further has a fourth MOS transistor coupled between the drain terminal of the second MOS transistor and the gate terminal of the third MOS transistor. The fourth MOS transistor uses a source terminal to couple to the drain terminal of the second MOS transistor, and uses a drain terminal to couple to the gate terminal of the third MOS transistor. The bias circuit is coupled to a gate terminal of the fourth MOS transistor to further bias the first MOS transistor through the fourth MOS transistor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
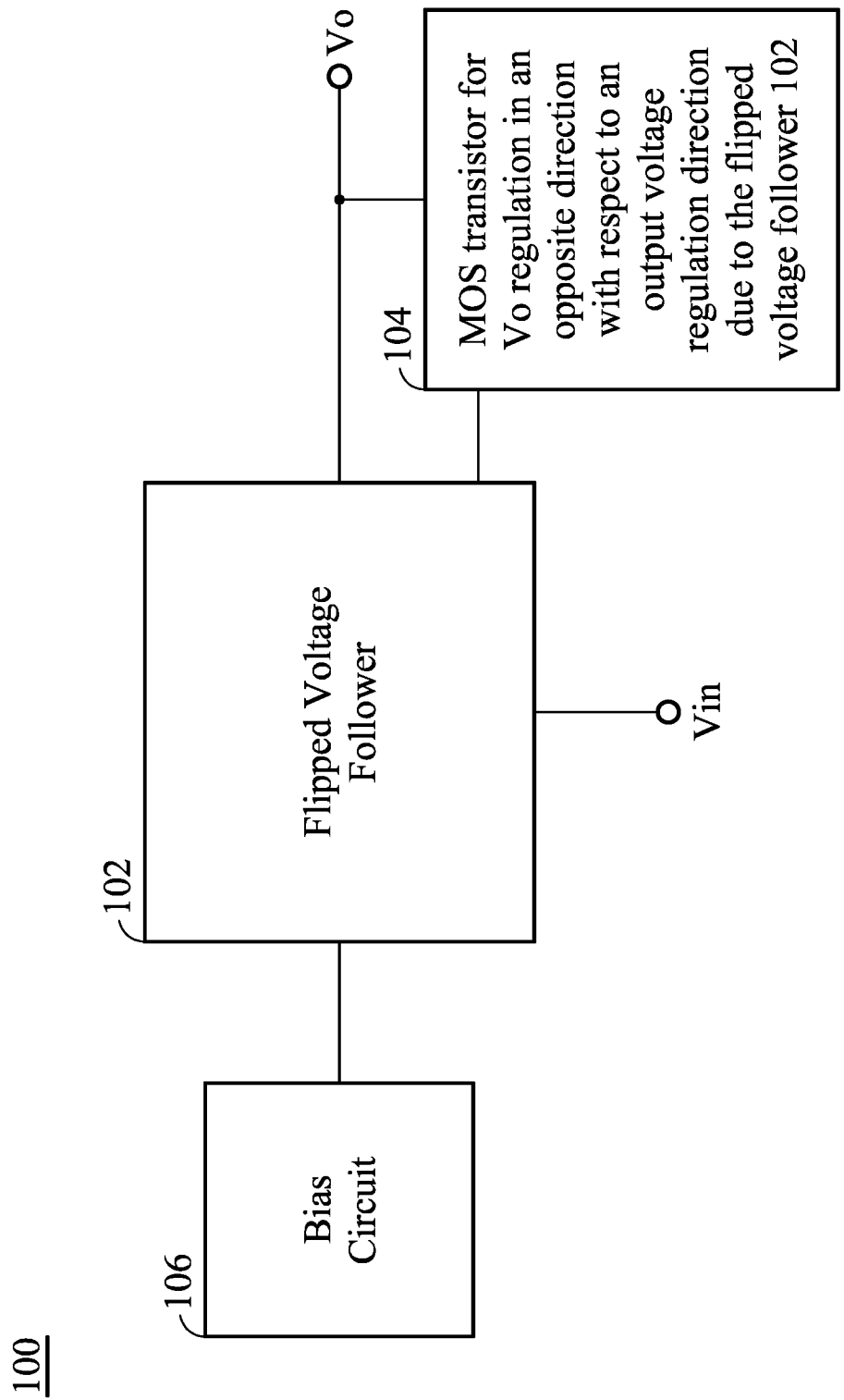
FIG. 1 depicts a fast-transient buffer 100 in accordance with an exemplary embodiment of the present invention.

FIG. 1 depicts a fast-transient buffer 100 in accordance with an exemplary embodiment of the present invention.

The fast-transient buffer 100 has a flipped voltage follower 102, a MOS transistor (e.g. a Metal-Oxide-Semiconductor Field-Effect Transistor, also abbreviated as MOSFET) 104, and a bias circuit 106. The flipped voltage follower 102 is coupled between an input terminal Vin and an output terminal Vo of the fast-transient buffer 100. The MOS transistor 104 is coupled to the flipped voltage follower 102 as well as the output terminal Vo of the fast-transient buffer 100. The bias circuit 106 is coupled to the flipped voltage follower 102, and is further capable of biasing the MOS transistor 104 through the flipped voltage follower 102.

According to such a design, the MOS transistor 104 regulates an output voltage (also marked as Vo) of the fast-transient buffer 100, in the opposite direction of the output voltage (Vo) regulation direction due to the flipped voltage follower 102.

In an exemplary embodiment wherein the flipped voltage follower 102 is provided to quickly regulate the overshoot of the output voltage Vo, the MOS transistor 104 is provided to quickly regulate the undershoot of the output voltage Vo.

In an exemplary embodiment wherein the flipped voltage follower 102 is provided to quickly regulate the undershoot of the output voltage Vo, the MOS transistor 104 is provided to quickly regulate the overshoot of the output voltage Vo.

In compared with a conventional flipped voltage follower that can only quickly regulate the overshoot (or undershoot) problem, the MOS transistor 104, such a simple device, can efficiently regulate the output voltage Vo to cure the deficiency of the conventional flipped voltage follower. The MOS transistor 104 is a low-power and fast solution.

Figure 2:
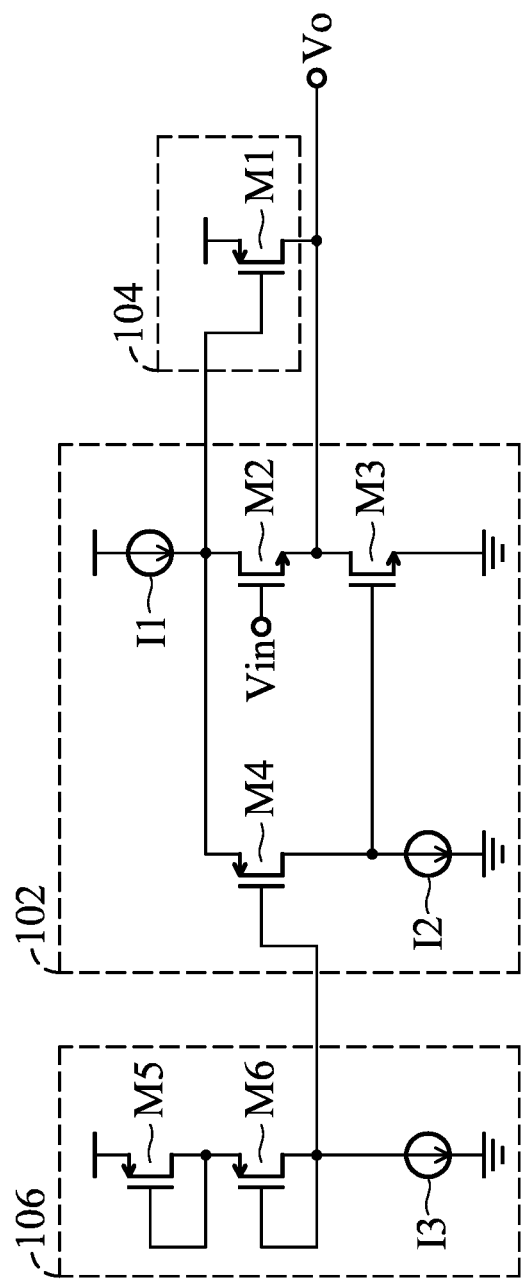
FIG. 2 depicts the details of the fast-transient buffer 100 in accordance with an exemplary embodiment of the present invention.

FIG. 2 depicts the details of the fast-transient buffer 100 in accordance with an exemplary embodiment of the present invention.

The MOS transistor 104 is implemented by a first MOS transistor M1 (which is a PMOS). The first MOS transistor M1 has a gate terminal coupled to the flipped voltage follower 102, a drain terminal coupled to the output terminal Vo of the fast-transient buffer, and a source terminal coupled to a power terminal.

The flipped voltage follower 102 has a second MOS transistor M2, a third MOS transistor M3, and a fourth MOS transistor M4. The second MOS transistor M2 and the third MOS transistor are two NMOS s. The second MOS transistor M2 has a gate terminal coupled to the input terminal Vin of the fast-transient buffer, a source terminal coupled to the output terminal Vo of the fast-transient buffer, and a drain terminal coupled to the gate terminal of the first MOS transistor M1. The third MOS transistor M3 has a drain terminal coupled to the source terminal of the second MOS transistor M2, a gate terminal coupled to the drain terminal of the second MOS transistor M2 through the fourth MOS transistor M4, and a source terminal coupled to a ground terminal. The fourth MOS transistor M4 is a PMOS, having a source terminal coupled to the drain terminal of the second MOS transistor M2, and a drain terminal coupled to the gate terminal of the third MOS transistor M3. The flipped voltage follower 102 further has a first current source I1 and a second current source I2. The first current source I1 is coupled to a connection terminal between the gate terminal of the first MOS transistor M1, the drain terminal of the second MOS transistor M2 and the source terminal of the fourth MOS transistor M4 to provide a first current (also marked as I1). The second current source I2 is coupled to a connection terminal between the drain terminal of the fourth MOS transistor M4 and the gate terminal of the third MOS transistor M3 to sink a second current (also marked as I2). In addition to the bias currents I1 and I2, the bias circuit 106 is proposed in this example.

Regulation of the output voltage Vo by the well biased circuits 102 and 104 is fast.

In response to an overshoot of the output voltage Vo, through the second MOS transistor M2 and the fourth MOS transistor M4, the overshoot is reflected to the gate terminal of the third MOS transistor M3. The third MOS transistor (an NMOS) M3, therefore, is turned on to sink current from the output terminal Vo. Thus, the overshoot of the output voltage Vo is quickly regulated.

In response to a undershoot of the output voltage Vo, through the second MOS transistor M2, the undershoot is reflected to the gate terminal of the first MOS transistor M1. The first MOS transistor (a PMOS) M1, therefore, is turned on to provide current to the output terminal Vo. Thus, the undershoot of the output voltage Vo is quickly regulated.

The more details of the bias circuit 106 presented in FIG. 2 are discussed here. The bias circuit 106 is coupled to a gate terminal of the fourth MOS transistor M4, and is capable of further biasing the first MOS transistor M1 through the fourth MOS transistor M4. As shown, the bias circuit 106 has a fifth MOS transistor M5 (that is a diode-connected PMOS), and a sixth MOS transistor M6 (that is another diode-connected PMOS). The fifth MOS transistor M5 and the sixth MOS transistor M5 are connected in series between the power terminal and the gate terminal of the fourth MOS transistor M4. The bias circuit 106 further has a third current source I3 that is coupled to a connection terminal between a drain terminal of the sixth transistor M6 and the gate terminal of the fourth transistor M4 to sink a third current (also marked as I3).

The bias circuit 106 biases the gate terminal of the fourth MOS transistor M4 at a bias voltage (VDD-2Vgs), where VDD is a power voltage at the power terminal, and Vgs is a voltage difference between a gate terminal and a source terminal of the fifth/sixth MOS transistor M5/M6. After increasing the bias voltage (VDD-2Vgs) by the gate-source voltage difference Vgs of the fourth MOS transistor M4, another bias voltage (VDD-Vgs) is generated and supplied to the gate terminal of the first MOS transistor M1. The first MOS transistor M1, thus, is well biased. The quiescent current through the first MOS transistor M1 may be the same as the third current I3. The third current I3 may be set to be much lower than the first current I1. The proposed buffer equipped with the first MOS transistor M1 is a low-power consumption design.

Figure 3:
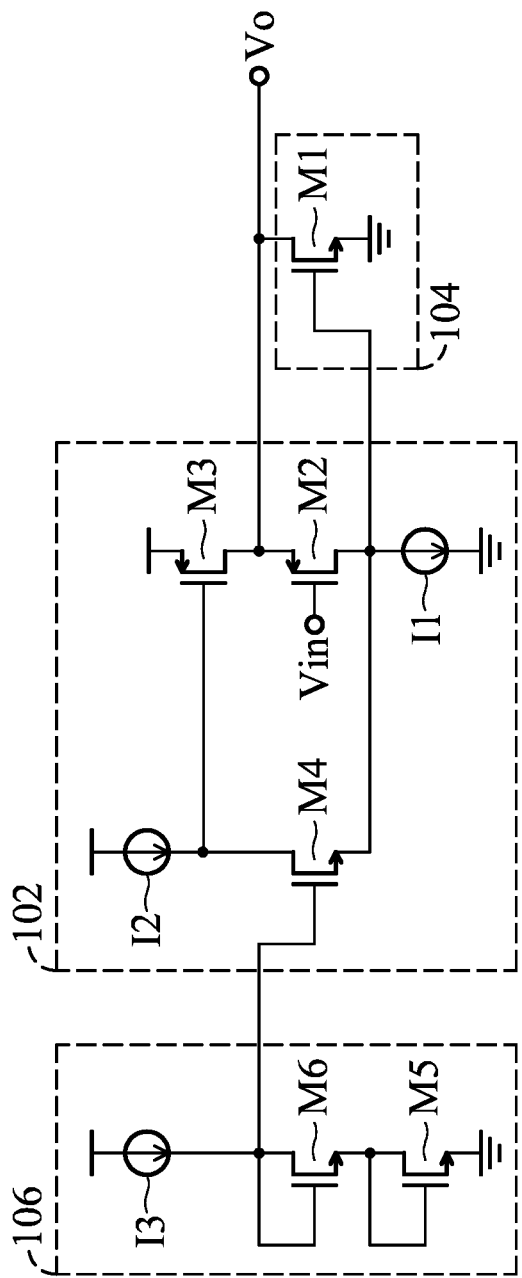
FIG. 3 depicts the details of the fast-transient buffer 100 in accordance with another exemplary embodiment of the present invention.

FIG. 3 depicts the details of the fast-transient buffer 100 in accordance with another exemplary embodiment of the present invention.

In FIG. 3, the first MOS transistor M1 is an NMOS, and the source terminal of the first MOS transistor M1 is coupled to a ground terminal. The second MOS transistor M2 and the third MOS transistor M3 are two PMOSs. The source terminal of the third MOS transistor M3 is coupled to the power terminal. The fourth MOS transistor M4 is an NMOS. The first current source I1 is coupled to a connection terminal between the gate terminal of the first MOS transistor M1, the drain terminal of the second MOS transistor M2 and the source terminal of the fourth MOS transistor M4 to sink the first current I1. The second current source I2 is coupled to a connection terminal between the drain terminal of the fourth MOS transistor M4 and the gate terminal of the third MOS transistor M3 to provide the second current I2. The well-biased circuits 102 and 104 (due to the currents I1, I2 and the bias circuit 106) quickly regulate the output voltage Vo.

In response to a undershoot of the output voltage Vo, through the second MOS transistor M2 and the fourth MOS transistor M4, the undershoot is reflected to the gate terminal of the third MOS transistor M3. The third MOS transistor (a PMOS) M3, therefore, is turned on to provide current to the output terminal Vo. Thus, the undershoot of the output voltage Vo is quickly regulated.

In response to an overshoot of the output voltage Vo, through the second MOS transistor M2, the overshoot is reflected to the gate terminal of the first MOS transistor M1. The first MOS transistor (an NMOS) M1, therefore, is turned on to sink current from the output terminal Vo. Thus, the overshoot of the output voltage Vo is quickly regulated.

In FIG. 3, the fifth MOS transistor M5 is a diode-connected NMOS, and the sixth MOS transistor M6 is another diode-connected NMOS. The fifth MOS transistor M5 and the sixth MOS transistor M5 are connected in series between the gate terminal of the fourth MOS transistor M4 and the ground terminal. The third current source I3 is coupled to a connection terminal between the drain terminal of the sixth transistor M6 and the gate terminal of the fourth transistor M4 to provide the third current I3. In this manner, the bias circuit 106 biases the gate terminal of the fourth MOS transistor M4 at a bias voltage 2Vgs. After decreasing the bias voltage 2Vgs by the gate-source voltage difference Vgs of the fourth MOS transistor M4, another bias voltage Vgs is generated and supplied to the gate terminal of the first MOS transistor M1. The first MOS transistor M1, thus, is well biased. The quiescent current through the first MOS transistor M1 may be the same as the third current I3. The third current I3 may be set to be much lower than the first current I1. The proposed buffer equipped with the first MOS transistor M1 is a low-power consumption design.

To implement a low-dropout regulator (LDO), some modifications are made to the circuits shown in FIG. 2 and FIG. 3.

Figure 4:
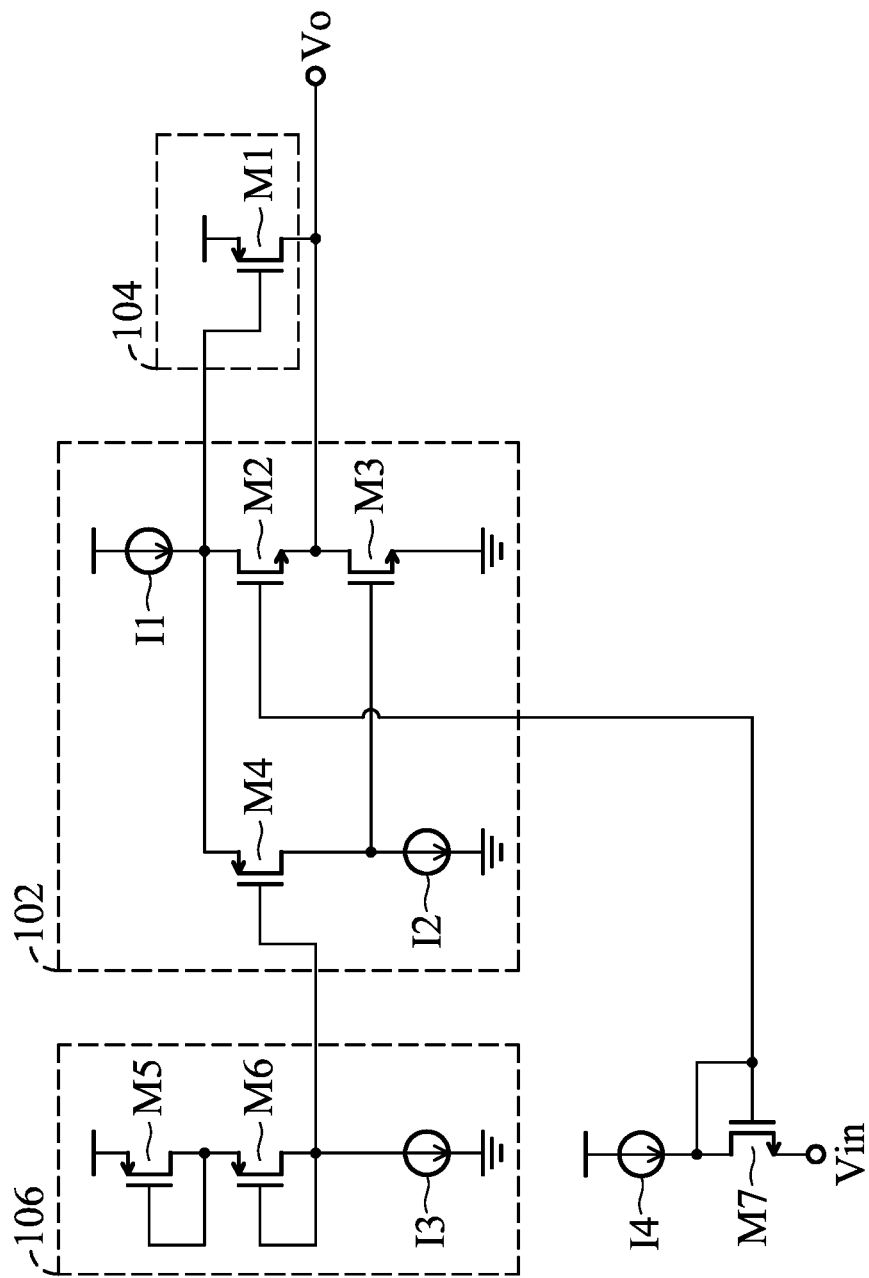
FIG. 4 depicts another buffer in accordance with an exemplary embodiment of the present invention, which is a low-dropout regulator (LDO) modified from the circuit shown in FIG. 2.

FIG. 4 depicts another buffer in accordance with an exemplary embodiment of the present invention, which is a low-dropout regulator (LDO) modified from the circuit shown in FIG. 2.

The LDO shown in FIG. 4 further comprises a seventh MOS transistor M7. The seventh MOS transistor M7 is a diode-connected NMOS coupled between the input terminal Vin and the gate terminal of the second MOS transistor M2 to raise the input voltage Vin using the gate-source difference Vgs of the seventh transistor M7. Thus, at the gate of the second MOS transistor M2, the voltage level is (Vin+Vgs). After decreasing the voltage level is (Vin+Vgs) at the gate of the second MOS transistor M2 by the gate-source difference Vgs of the second MOS transistor M2, the output voltage Vo follows Vin.

FIG. 4 further shows a fourth current source I4, which is coupled to a drain terminal of the seventh MOS transistor M7 to provide a fourth current (also marked as I4). In an exemplary embodiment, the fourth current I4 equals the first current I1, and the seventh MOS transistor M7 is the same size as the second MOS transistor M2.

Figure 5:
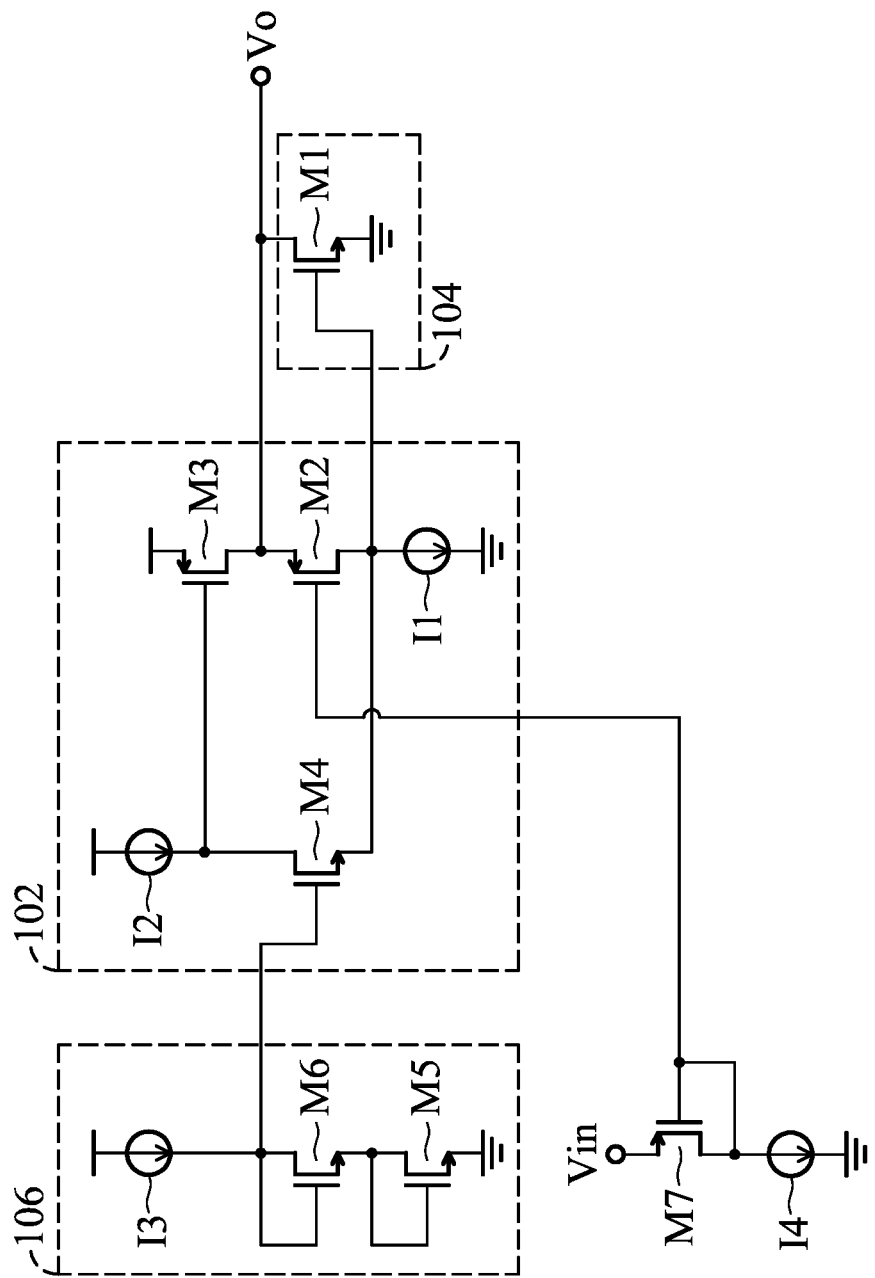
FIG. 5 depicts another buffer in accordance with an exemplary embodiment of the present invention, which is a low-dropout regulator (LDO) modified from the circuit shown in FIG. 3.

FIG. 5 depicts another buffer in accordance with an exemplary embodiment of the present invention, which is a low-dropout regulator (LDO) modified from the circuit shown in FIG. 3.

Referring to the LDO shown in FIG. 5, the seventh MOS transistor M7 is a diode-connected PMOS coupled between the input terminal Vin and the gate terminal of the second MOS transistor M2 to decrease the input voltage Vin using the gate-source difference Vgs of M7. Thus, at the gate of the second MOS transistor M2, the voltage level is (Vin-Vgs). After increasing the voltage level is (Vin-Vgs) at the gate of the second MOS transistor M2 by the gate-source difference Vgs of the second MOS transistor M2, the output voltage Vo follows Vin.

In FIG. 5, the fourth current source I4 is coupled to a drain terminal of the seventh MOS transistor M7 to sink the fourth current I4. In an exemplary embodiment, the fourth current I4 equals the first current I1, and the seventh MOS transistor M7 is the same size as the second MOS transistor M2.

Any buffer or voltage regulator having a flipped voltage follower equipped with the proposed first MOS transistor M1 should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fast-transient buffer, comprising:
   a flipped voltage follower and a bias circuit coupled to the flipped voltage follower, wherein the flipped voltage follower is coupled between an input terminal and an output terminal of the fast-transient buffer; and
   a first MOS transistor, coupled to the flipped voltage follower as well as the output terminal of the fast-transient buffer, wherein the first MOS transistor regulates an output voltage of the output terminal of the fast-transient buffer, in an opposite direction in comparison with an output voltage regulation direction due to the flipped voltage follower;
   wherein:
   the first MOS transistor has a drain terminal coupled to the output terminal of the fast-transient buffer,
   the flipped voltage follower has a second MOS transistor, a third MOS transistor, and a fourth MOS transistor;
   the second MOS transistor has a gate terminal coupled to the input terminal of the fast-transient buffer, a source terminal coupled to the output terminal of the fast-transient buffer, and a drain terminal coupled to a gate terminal of the first MOS transistor;
   the third MOS transistor has a drain terminal coupled to the source terminal of the second MOS transistor;
   the fourth MOS transistor has a source terminal coupled to the drain terminal of the second MOS transistor, and a drain terminal coupled to the gate terminal of the third MOS transistor; and
   the bias circuit is coupled to a gate terminal of the fourth MOS transistor to further bias the first MOS transistor through the fourth MOS transistor.

2. The fast-transient buffer as claimed in claim 1, wherein:
   the first MOS transistor is a PMOS, and the source terminal of the first MOS transistor is coupled to a power terminal;
   the second MOS transistor is an NMOS;
   the third MOS transistor is an NMOS, and a source terminal of the third MOS transistor is coupled to a ground terminal; and
   the fourth MOS transistor is a PMOS.

3. The fast-transient buffer as claimed in claim 2, wherein the flipped voltage follower further comprises:
   a first current source, coupled to a connection terminal between the gate terminal of the first MOS transistor, the drain terminal of the second MOS transistor and the source terminal of the fourth MOS transistor to provide a first current; and
   a second current source, coupled to a connection terminal between the drain terminal of the fourth MOS transistor and the gate terminal of the third MOS transistor to sink a second current.

4. The fast-transient buffer as claimed in claim 3, wherein the bias circuit comprises:
   a fifth MOS transistor that is a diode-connected PMOS; and
   a sixth MOS transistor that is a diode-connected PMOS;
   wherein the fifth MOS transistor and the sixth MOS transistor are connected in series between the power terminal and the gate terminal of the fourth MOS transistor.

5. The fast-transient buffer as claimed in claim 4, wherein the bias circuit further comprises:
   a third current source, coupled to a connection terminal between a drain terminal of the sixth transistor and the gate terminal of the fourth transistor to sink a third current.

6. The fast-transient buffer as claimed in claim 3, further comprising:
   a seventh MOS transistor that is a diode-connected NMOS coupled between the input terminal of the fast-transient buffer and the gate terminal of the second MOS transistor to raise an input voltage that the fast-transient buffer receives via the input terminal.

7. The fast-transient buffer as claimed in claim 6, further comprising:
a fourth current source, coupled to a drain terminal of the seventh MOS transistor to provide a fourth current.

8. The fast-transient buffer as claimed in claim 7, wherein:
the fourth current equals the first current; and
the seventh MOS transistor is the same size as the second MOS transistor.

9. The fast-transient buffer as claimed in claim 1, wherein:
the first MOS transistor is an NMOS, and the source terminal of the first MOS transistor is coupled to a ground terminal;
the second MOS transistor is a PMOS;
the third MOS transistor is a PMOS, and a source terminal of the third MOS transistor is coupled to a power terminal; and
the fourth MOS transistor is an NMOS.

10. The fast-transient buffer as claimed in claim 9, wherein the flipped voltage follower further comprises:
a first current source, coupled to a connection terminal between the gate terminal of the first MOS transistor, the drain terminal of the second MOS transistor and the source terminal of the fourth MOS transistor to sink a first current; and
a second current source, coupled to a connection terminal between the drain terminal of the fourth MOS transistor and the gate terminal of the third MOS transistor to provide a second current.

11. The fast-transient buffer as claimed in claim 10, wherein the bias circuit comprises:

a fifth MOS transistor that is a diode-connected NMOS; and
a sixth MOS transistor that is a diode-connected NMOS;
wherein the fifth MOS transistor and the sixth MOS transistor are connected in series between the gate terminal of the fourth MOS transistor and the ground terminal.

12. The fast-transient buffer as claimed in claim 11, wherein the bias circuit further comprises:
a third current source, coupled to a connection terminal between a drain terminal of the sixth transistor and the gate terminal of the fourth transistor to provide a third current.

13. The fast-transient buffer as claimed in claim 10, further comprising:
a seventh MOS transistor that is a diode-connected PMOS coupled between the input terminal of the fast-transient buffer and the gate terminal of the second MOS transistor to decrease an input voltage that the fast-transient buffer receives via the input terminal.

14. The fast-transient buffer as claimed in claim 13, further comprising:
a fourth current source, coupled to a drain terminal of the seventh MOS transistor to sink a fourth current.

15. The fast-transient buffer as claimed in claim 14, wherein:
the fourth current equals the first current; and
the seventh MOS transistor is the same size as the second MOS transistor.

* * * * *